United States Patent [19]
Ciraula et al.

[11] Patent Number: 5,706,237
[45] Date of Patent: Jan. 6, 1998

[54] SELF-RESTORE CIRCUIT WITH SOFT ERROR PROTECTION FOR DYNAMIC LOGIC CIRCUITS

[75] Inventors: Michael Kevin Ciraula, Round Rock; George McNeil Lattimore, Austin; Terry Lee Leasure, Georgetown; Gus Wai-Yan Yeung, Austin, all of Tex.

[73] Assignee: International Business Machines Corporation, Armonk, N.Y.

[21] Appl. No.: 729,823

[22] Filed: Oct. 8, 1996

[51] Int. Cl.$^6$ ........................................... G11C 11/401
[52] U.S. Cl. ........................................... 365/222; 365/204
[58] Field of Search ........................... 365/222, 203, 365/204, 228

[56] References Cited

U.S. PATENT DOCUMENTS 5,262,995 11/1993 Yu ............................................. 365/203
5,274,590 12/1993 Kashimura ............................. 365/203

Primary Examiner—Tan T. Nguyen
Attorney, Agent, or Firm—Anthony V.S. England; Brian F. Russell; Andrew J. Dillon

[57] ABSTRACT

An improved self-restore circuit and method for restoring the output line of a dynamic logic circuit. The self-restore circuit includes two transistors connected in series between the output line and the reference voltage node. The first transistor activates after an evaluation of the output line, while the second transistor only activates subsequent to the activation of the first transistor and the completion of an evaluation cycle. The self-restore circuit reduces the power consumption and safeguards against any soft error hits, wherein the second transistor protects against any soft error hits by actively pulling up the output line to the appropriate voltage.

20 Claims, 3 Drawing Sheets 5,706,237

1

SELF-RESTORE CIRCUIT WITH SOFT ERROR PROTECTION FOR DYNAMIC LOGIC CIRCUITS

BACKGROUND OF THE INVENTION

1. Cross-Reference to Related Applications

The present application is related to application Ser. No. 08/525,939 (Attorney Docket No. AA9-95-077), entitled "High-Speed SRAM With OR-Gate Sense," filed Sep. 8, 1995.

2. Technical Field

The present invention relates, in general, to dynamic logic circuits and, in particular, to a device and method for restoring (recharging) the output line of a dynamic logic circuit following the discharge of the output line. Still more particularly, the present invention relates to a device and method for restoring the output line of a dynamic logic circuit following the discharge of the output line while reducing power consumption and providing protection against the introduction of a so-called "soft error" (SER) in the dynamic logic circuit.

3. Description of the Related Art

The use of complementary metal oxide semiconductor field effect transistors (C-MOSFETs) in dynamic logic circuitry has become popular in recent years because of the advantages of low power consumption, high-speed capabilities, and small layout area requirements. One common logic cell in such circuits consists of a single P-type MOSFET (P-MOSFET) with a clock input, an N-type MOSFET (N-MOSFET) logic circuit with one or more N-MOSFETs with one or more logic inputs, and a single N-MOSFET with a clock input. The output node is precharged to approximate the power supply voltage VDD by the P-MOSFET and is conditionally discharged to the circuit reference VSS by the logic circuit in cooperation with the single N-MOSFET in accordance with a single-phase clock. The precharge phase occurs when the clock is low (logic 0), thereby turning on the P-MOSFET "precharge" transistor, and the "evaluate" phase occurs when the clock is high (logic 1), thereby turning on the single N-MOSFET "discharge" transistor or "ground switch." Frequently, a static C-MOSFET inverter cell follows this logic cell so as to allow a single clock signal to precharge and evaluate a cascaded set of such dynamic logic blocks. This type of dynamic logic is often referred to as "domino" logic.

Today, domino circuits can be used to replace sense amplifiers, traditionally utilized in conventional RAMs, to create a domino SRAM. However, even in a domino SRAM, the bit lines of the read path typically need to be restored after each evaluation. Restoring bit lines typically involves pulling up the read data output line to a specific reference voltage after the read data output line has been discharged.

To ensure correct functionality, the restore cycle must be delayed until the evaluate cycle is entirely completed. If the evaluate cycle has not completed when the restore cycle initiates, the pulldown transistors, which cause the data output line to discharge, will remain active longer than the pullup transistors, causing the data output line to be reset. This will result in so-called "DC fight", which causes excess power dissipation.

Generally, in dynamic logic circuits, including domino SRAMs, the evaluation signals will be active during a clock pulse, and become inactive on the clock's change from the enabling logical state to the disabling logical state. The necessary delay is usually accomplished by connecting the restore signal to a chain of inverters which allow the pulldown transistors to turn off before the restore signal turns on the pullup transistors to reset the bit lines for the read path of a domino SRAM.

Although this method minimizes DC fight, the added inverters in the delay chain cost significant power consumption in the register file because, in domino SRAM, for example, there are many stages or groups of memory cells that need to be restored after each evaluate cycle. The number of inverters is directly proportional to the size of the memory and stages or groups of memory cells. When the restore signal switches, all of the inverters switch and therefore draw power.

Another problem with the typical delay chain is that it provides no protection against soft errors. The reduced feature size and lower power supply of modern CMOS makes memory arrays and dynamic logic circuits sensitive to being upset by alpha particles and cosmic rays. In a normal delay chain, there is no active pullup device to restore the memory array after a soft error causes a drop on the signal line.

SUMMARY OF THE INVENTION

It is therefore one object of the present invention to provide a more reliable dynamic logic circuit.

It is another object of the present invention to provide a new and novel device and method for restoring the output line of a dynamic logic circuit following an evaluation.

It is yet another object of the present invention to provide a device and method for restoring the output line of a dynamic logic circuit following each evaluation while reducing the power consumption and providing protection from the introduction of soft error hits which cause unexpected drops on the output line.

The foregoing objects are achieved as is now described. An improved self-restore circuit and method for restoring the output line of a dynamic logic circuit. The self-restore circuit includes two transistors connected in series between the output line and the reference voltage node. The first transistor activates after an evaluation of the output line, while the second transistor only activates subsequent to the activation of the first transistor and the completion of an evaluation cycle. The self-restore circuit reduces the power consumption and safeguards against any soft error hits, wherein the second transistor protects against any soft error hits by actively pulling up the output line to the appropriate voltage.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

The present invention relates to an improvement in restoring the output line of a dynamic logic circuit. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Dynamic logic circuits, also referred to as domino logic circuits when dynamic logic circuits are cascaded in series, are commonly utilized in processor logic. Typically, these circuits have been used to increase performance of logic circuits. But now, the use of domino circuits have been extended to memory circuits, as disclosed in the copending application Ser. No 08/525,939, entitled "High Speed SRAM With OR-Gate Sense," which is herein incorporated by reference and which discloses a system and method for combining an SRAM with a domino circuit to provide a domino SRAM that has an OR-gate sense function.

It is to be understood that this novel invention of recharging output lines is not limited to a domino SRAM but rather applies generally to precharging of dynamic logic circuits. Those skilled in the art will appreciate that the output lines of dynamic logic circuits may require restoring in processor logic circuits, arithmetic logic circuits, or other logic circuits that utilize multi-stage multiplexers. For the purposes of this invention, the domino SRAM is just one example provided to illustrate a preferred embodiment of the invention.

Figure 1:
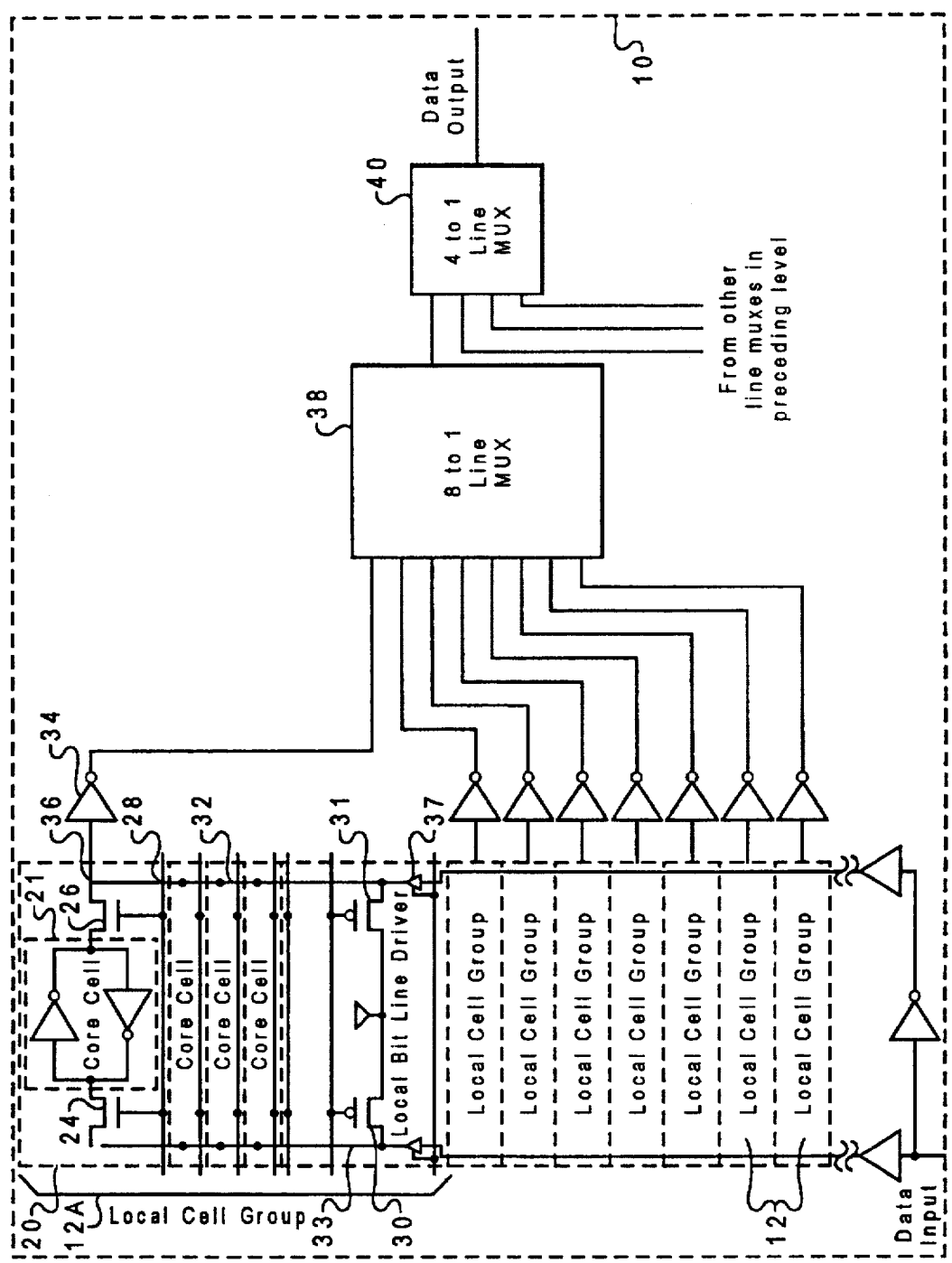
FIG. 1 depicts a block diagram of a one-column array in a domino SRAM in accordance with a preferred embodiment of the present invention.

With reference now to the figures and in particular with reference to FIG. 1, which depicts a block diagram of one column of arrays in a domino SRAM 10. Each column comprising the SRAM 10 is divided into local cell groups 12. As shown in expanded local cell group 12A, each local cell group 12 includes four core cells 20, and a local bit line driver 37 for writing data into the core cells 20. Rows of core cells 20 formed from adjacent local cell groups 12A in the array constitute a memory word. Each core cell 20 comprising a memory word is coupled to a conventional word line 28. In addition, each core cell 20 in the SRAM 10 includes two transistors 24 and 26 coupled to the word line 28, and a cross-coupled inverter 21 coupled between two transistors 24 and 26.

The SRAM 10 replaces conventional sense amplifiers used in SRAMs by partitioning conventional global bit lines into a local bit line 32 and a local bit line 33 for each of the local cell groups 12. A precharge device 30 is coupled to each of the local bit lines 33, and a precharge device 31 and a ratioed inverter 34 are coupled to each one of the local bit lines 32. The combination of the local bit line 32, the precharge device 31, and the ratioed inverter 34 transforms a conventional global bit line into a dynamic node 36 of a domino circuit, and provides the sense function for the cell group 12A. Each of the inverters 34 corresponding to a local cell group 12 are input to a multiplexer tree hierarchy comprising an eight-way input line-multiplexer 38 and a four-way input line-multiplexer 40 in order to produce the output data. While multi-input OR gates have been typically depicted in domino SRAMs instead of multi-input line-multiplexers 38 and 40, for the purposes of this invention, multi-input line-multiplexers are shown for a clearer illustration.

Figure 2:
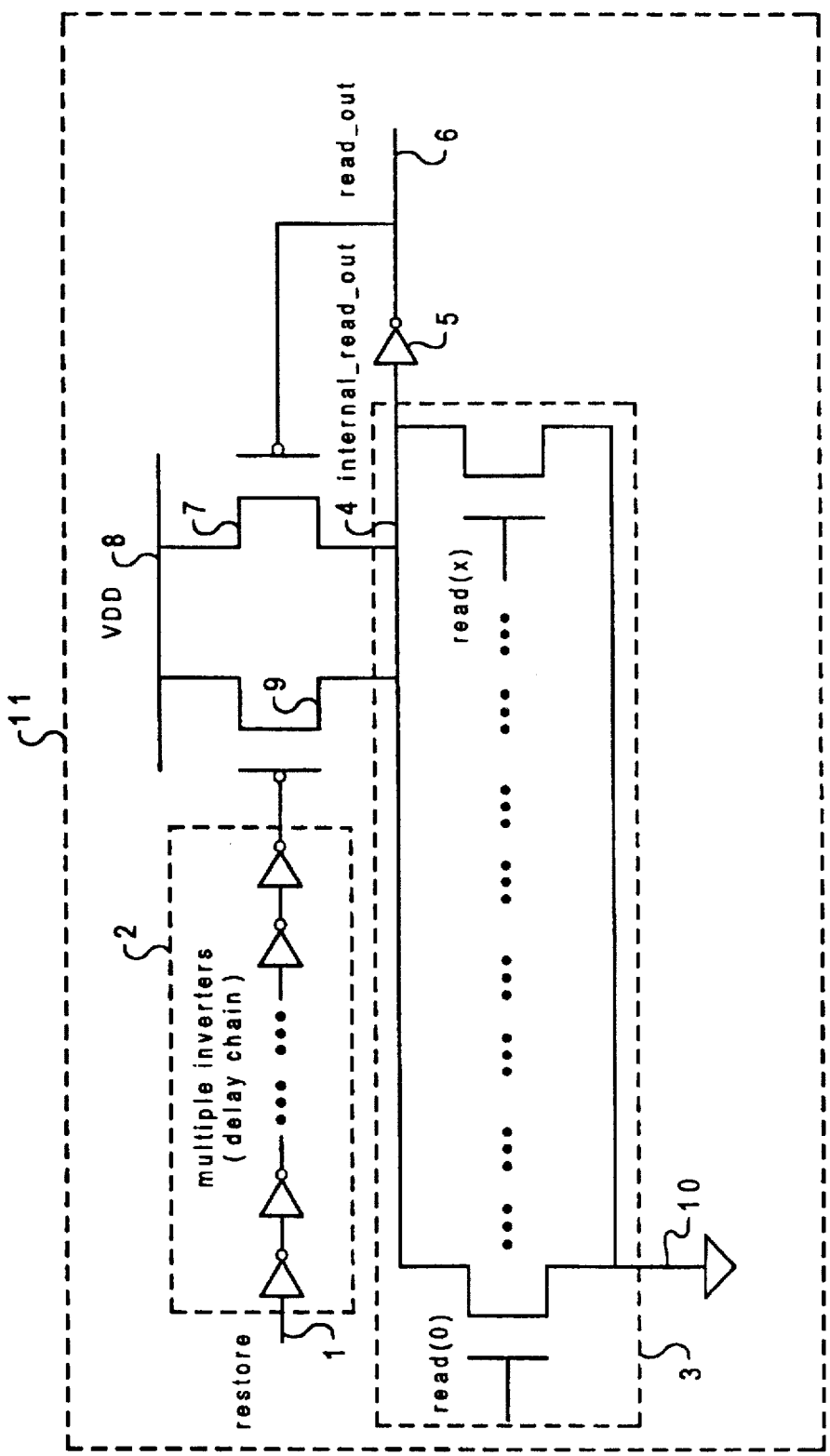
FIG. 2 is a self-restore circuit for a domino SRAM read path according to prior art.

The standard delay chain restore circuit 11 for SRAM shown in FIG. 2 is a detailed depiction of the eight-way input line-multiplexer 38 of FIG. 1. Typically the outputs of the local cell group 12 of FIG. 1 are coupled to the gates of the read transistors 3 of FIG. 2, and similarly, the inputs of the second line-multiplexer 40 of FIG. 1 are coupled to gates of the read transistors 3 of another standard delay chain restore circuit 11 of FIG. 2. Therefore, it is possible to cascade the standard delay chain restore circuit 11 shown in FIG. 2 in series by coupling the read_out line 6 of the first restore circuit to one of the read transistors of the second circuit and so on. It is noted that the number of read transistors 3 used in the standard delay chain restore circuit 11 as shown in FIG. 2 can vary with the number of inputs needed.

As stated above, FIG. 2 depicts a standard delay chain restore circuit 11 for domino SRAM read path, which restores the read bit lines for the read path of a domino SRAM after each evaluate cycle. The restore signal 1 will usually be some form of a system clock. The restore signal 1 is delayed by series of inverters 2, where the last inverter in the chain is connected to the gate of the P-channel transistor 9. The P-channel transistor 9 is further coupled between the supply source (VDD) 8 and the internal_read_out line 4. Another P-channel transistor 7 is also connected between VDD 8 and the internal_read_out line 4. Furthermore, a plurality of read transistors 3 (shown as N-channel) are connected between the internal_read_out line 4 and the ground 10. Also, an inverter 5 is coupled between output node 6 and the drains of the P-channel transistor 7 and read transistors 3.

The output from the standard delay chain restore circuit 11 for SRAM is obtained at node 6, which is at the junction of the gate of transistor 7 and output of the inverter 5. The purpose of transistor 9 is to raise the potential of internal_read_out line 4 to a higher voltage state (VDD) before transistor 7 activates. Transistor 7 maintains internal_read_out line 4 at VDD potential whenever the internal_read_out line 4 has gone high (a higher voltage state, which is also a logic "1" state).

The restore circuit 11 in FIG. 2 can be used to restore the SRAM array after each evaluate cycle. And, to ensure correct functionality and minimize DC fight, the restore cycle 1 has to be delayed until the evaluate cycle is entirely completed. To accomplish this, the inverters 2 are used to delay the restore signal 1, which, as mentioned before, will usually be some form of a system clock. For example, the evaluate cycle may be enabled when the clock goes high and the restore cycle may be enabled when the clock goes low. The delay chain consisting of a series of inverters 2 must delay the restore signal 1 long enough such that the pull-down device will be turned off when the pullup device turns on and vice versa.

While the restore circuit 11 shown in FIG. 2 may reduce DC fight to minimum, the multiple inverters 2 in the delay chain cost significant power consumption in the register file because in ripple array, there are many stages or groups of memory cells that need to be restored after each evaluate cycle. The number of inverters is directly proportional to the size of the memory and stages or groups of memory cells. When the restore signal 1 switches, all of the inverters 2 switch and therefore draw power. Furthermore, another problem with the typical delay chain 2 as shown in FIG. 2 is that it provides no protection against soft error (SER). The reduced feature size and lower power supply of modern CMOS makes memory arrays sensitive to being upset by alpha particles and cosmic rays. So, in the delay chain 1 as depicted in FIG. 2, there is no active pullup device to restore the memory array after SER causes a drop on the signal line. Therefore, to reduce power consumption and provide protection from the introduction of soft error hits which cause unexpected drops on the output line, an improved self-restore circuit 11 is illustrated in FIG. 3.

Figure 3:
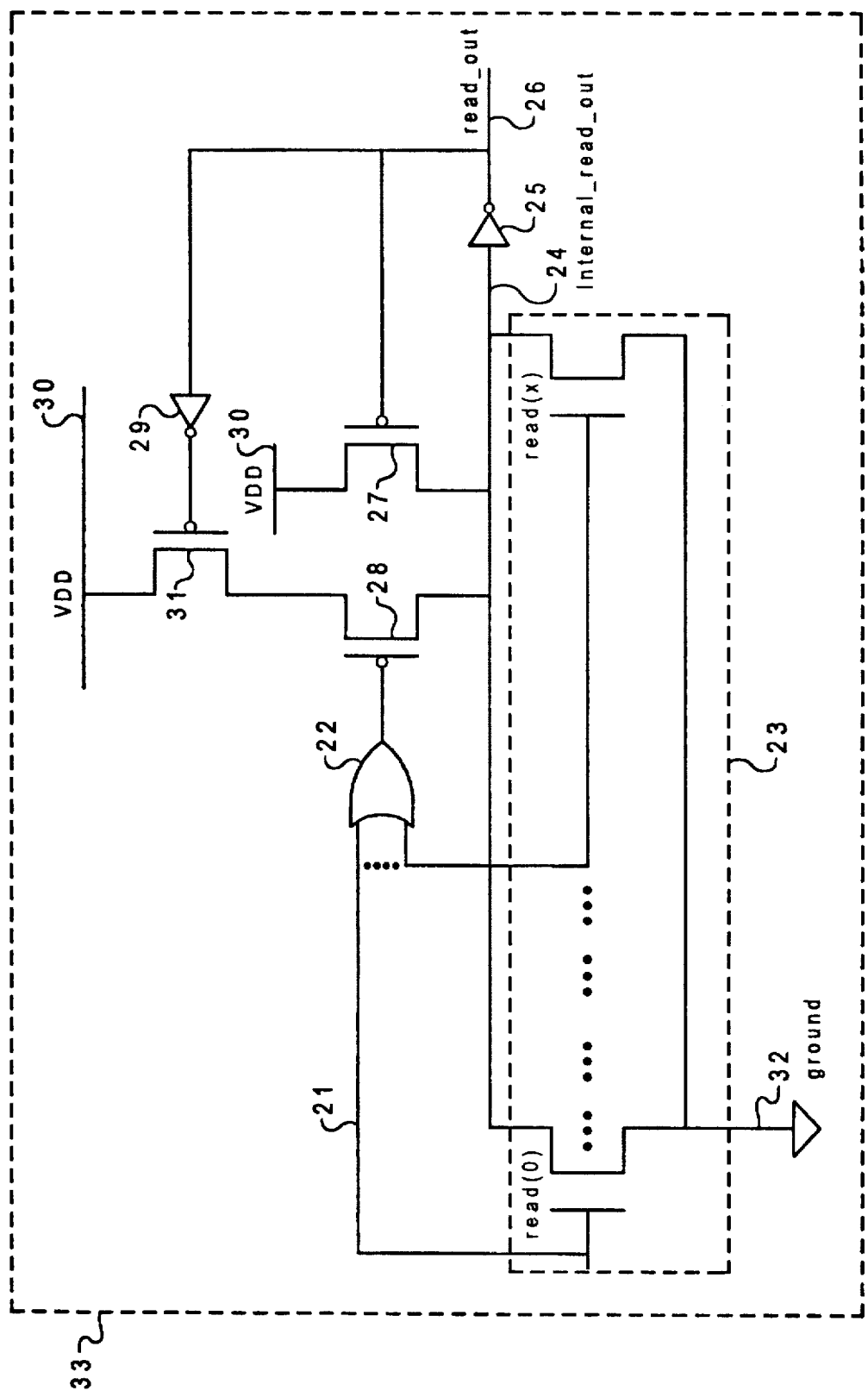
FIG. 3 is a self-restore circuit for a domino SRAM read path in accordance with the present invention.

As shown in FIG. 3, the multiple inverters 2 in FIG. 2, have been replaced by a single OR gate 22 which has multiple inputs, can be either static or dynamic, and is skewed to bigger P-channel. The read transistors 23 (shown as N-channel transistors) are coupled between the internal__read__out line 24 and the ground 32, and the gates of the read transistors 23 are coupled to the input of the OR gate 22. The output from the OR gate 22 is coupled to the gate of the P-channel transistor 28. It is noted that a clock can be utilized in lieu of the OR gate as an alternative method of restore signal.

The enhanced restore circuit 34 has three P-channel transistors 27, 28, and 31. Two of the P-channel transistors 28 and 31 serve the purpose of raising the internal__read__out line to a higher voltage state (close to VDD), while the third P-channel transistor 27 operates as a "pull-up" device and raises the internal__read__out line 24 all the way up to VDD potential. The top P-channel transistor 31 is coupled between the supply source (VDD) 30 and the source of bottom P-channel transistor 28, while its gate is coupled to an inverter 29. The bottom P-channel transistor 28 is further connected between drain of the top P-channel transistor 31 and the internal__read__out line 24. The third P-channel transistor 27, also referred to as the half latch, is coupled between the supply source (VDD) 30 and the output of an inverter 25.

The output from the standard delay chain restore circuit 34 for SRAM is obtained at node 26, which is at the junction of the gate of transistor 27 and output of the inverter 25. The inverter 25, also referred to as the driver, is skewed to bigger P-channel and is coupled between the drains of the read transistors 23 and the output node 26. The N-channel read transistors 23, commonly referred to as the pull down transistors, are coupled between internal__read__out line 24 and the ground 32.

In FIG. 3, when any one of the "read" signals is active, the read path 24 will be discharged and the bottom P-channel transistor 28 will be off. When the internal__read__out line 24 is almost discharged, the top P-channel transistor 31 will be turned on, the bottom P-channel transistor 28 will still be off. When all "read" signals are inactive, the bottom P-channel transistor 28 will be turned on. The purpose of the skewed OR gate 22 is to ensure that the bottom P-channel transistor 28 is on after the N-channel transistors 23 (the discharge device in the SRAM circuit) is off. When both P-channel transistors 28 and 31 are turned on, the internal__read__out line 24 will be precharged high, very close to VDD 30, before the top P-channel 31 will be shut off by the feedback path. Also, the driver 25 is skewed to bigger P-channel so that the top P-channel transistor 31 will not shut off until the internal__read__out line 24 reaches very close to VDD 30. The top P-channel transistor 31 will be turned off as soon as the internal__read__out line 24 is precharged high, at which time the half-latch 27 will activate and precharge the internal__read__out line 24 all the way to VDD 30.

The utilization of an OR gate 22 (or a clock) as the input to the bottom P-channel transistor 28 reduces the power consumption problem existing in the precharge circuit 11 (prior art) of FIG. 2. Furthermore, the addition of the top P-channel transistor 31 will safeguard against any soft error hits since the top P-channel transistor 31 in FIG. 3 will actively pullup any drop in the voltage to the internal__read__out line 24. Note that the bottom P-channel transistor 28 will be on since no "read" signals would be active. The new self-restore circuit shown in FIG. 3, therefore, not only reduces power consumption but also protects against soft error hits.

While the invention has been particularly shown and described with reference to a preferred embodiment, it will be understood by those skilled in the art that various changes in form and detail may be made therein without departing from the spirit and scope of the invention.

What is claimed is:

1. A self-restore circuit for restoring a dynamic logic circuit comprising:

an output line of said dynamic logic circuit, wherein said output line discharges after an evaluation cycle;

first transistor and a second transistor connected in series between said output line and a reference voltage node, wherein said first transistor is activated after an evaluation of said output line, and said second transistor is only activated subsequent to activation of said first transistor in response to an indication that the said evaluation cycle is complete; and means for restoring said output line of said dynamic logic circuit in response to activation of said first transistor and said second transistor.

2. A self-restore circuit according to claim 1, wherein said indication that said evaluation cycle is complete includes an output of a logic gate; said logic gate having as inputs a plurality of input evaluation lines, wherein each of said plurality of input evaluation lines determines whether said evaluation cycle is still active.

3. A self-restore circuit according to claim 2, wherein said logic gate is an OR gate skewed to bigger P-channel.

4. A self-restore circuit according to claim 1, and further comprising a half latch for completing said restoring of the said output line of said dynamic logic circuit; said half latch activating in response to said output line being charged.

5. A self-restore circuit according to claim 1, and further comprising an output driver connected to said output line, wherein said output driver is skewed to bigger P-channel.

6. A self-restore circuit according to claim 1, wherein said output line is automatically restored in response to an error causing a drop on said output line.

7. A self-restore circuit according to claim 1, wherein said means for restoring said output line of said dynamic logic circuit in response to activation of said first transistor and said second transistor includes an electric current.

8. A self-restore circuit according to claim 1, wherein said dynamic logic circuit is a dynamic Or-gate.

9. A self-restore circuit according to claim 1, wherein said dynamic logic circuit is a dynamic multiplexer.

10. A method of restoring an output line of a dynamic logic circuit; said dynamic logic circuit including a first transistor and a second transistor coupled in series between said output line and a reference voltage node, comprising the steps of:

evaluating the output line of said dynamic logic circuit;

activating said first transistor in response to the discharge of said output line; and activating said second transistor only after activation of said first transistor, in response to an indication that the evaluation cycle is complete.

11. The method of claim 10, including the further step of activating a half latch in response to said output line being restored; said half latch holding said output line at the voltage level of said reference node until next said evaluation cycle.

12. The method of claim 10, including the further step of automatically restoring the output line in response to noise causing a drop on said output line.

13. A memory device comprising:

a memory cell array having a plurality of memory cells, said memory cells being arranged at positions where a plurality of bit lines cross a plurality of word lines;

a selection signal for selecting one of said memory cells in accordance with a data writing or reading operation; and a restore circuit for restoring said memory device, including:

an output line of said memory device, wherein said output line discharges after an evaluation cycle;

first transistor and a second transistor connected in series between said output line and a reference voltage node, wherein said first transistor is activated after an evaluation of said output line, and said second transistor is only activated subsequent to activation of said first transistor in response to an indication that the said evaluation cycle is complete; and means for restoring said output line of said memory device in response to activation of said first transistor and said second transistor.

14. A memory device as in claim 13 wherein said indication that said evaluation cycle is complete includes an output of a logic gate; said logic gate having as inputs a plurality of input evaluation lines, wherein each of said plurality of input evaluation lines determines whether said evaluation cycle is still active.

15. A memory device as in claim 14 wherein said logic gate is an OR gate skewed to bigger P-channel.

16. A memory device as in claim 13, and further comprising a half latch for completing said restoring of said output line of said memory device; said half latch activating in response to said output line being charged.

17. A memory device as in claim 13, and further comprising an output driver connected to said output line, wherein said output driver is skewed to bigger P-channel.

18. A memory device as in claim 13 wherein said output line is automatically restored in response to an error causing a drop on said output line.

19. A memory device as in claim 13 wherein said means for restoring said output line of said memory device in response to activation of said first transistor and said second transistor includes an electric current.

20. A memory device as in claim 13 wherein said memory device is a domino SRAM, including:

at least one of said plurality of local cell groups further comprising, a plurality of core cells for storing information, and a local bit line coupled to said plurality of core cells; and a domino circuit coupled to said local bit line for sensing information stored in said plurality of core cells.

* * * * *